(12) United States Patent
VanderSpek et al.

(10) Patent No.: US 11,126,594 B2
(45) Date of Patent: Sep. 21, 2021

(54) DELTA COMPRESSION

(71) Applicant: Exagrid Systems, Inc., Westborough, MA (US)

(72) Inventors: Adrian T. VanderSpek, Worcester, MA (US); Steven Allan Tague, Tyngsboro, MA (US)

(73) Assignee: Exagrid Systems, Inc., Marlborough, MA (US)

( * ) Notice: Subject to any disclaimer, the term of this patent is extended or adjusted under 35 U.S.C. 154(b) by 59 days.

(21) Appl. No.: 15/893,163

(22) Filed: Feb. 9, 2018

(65) Prior Publication Data
US 2019/0251189 A1    Aug. 15, 2019

(51) Int. Cl.
*G06F 16/174* (2019.01)
*G06F 11/14* (2006.01)
*H03M 7/30* (2006.01)

(52) U.S. Cl.
CPC ...... *G06F 16/1744* (2019.01); *G06F 11/1458* (2013.01); *G06F 16/1756* (2019.01); *H03M 7/3091* (2013.01)

(58) Field of Classification Search
CPC ............. G06F 16/1744; G06F 16/1756; G06F 3/0608; G06F 3/0661; G06F 11/1458; G06F 16/24556; G06F 3/064; G06F 3/0641; H03M 7/3091; H03M 7/30; H03M 7/3068; H03M 7/3086; H03M 7/3084; Y10S 707/99936

(Continued)

(56) References Cited

U.S. PATENT DOCUMENTS 9,825,648 B1 * 11/2017 Gopal ................. H03M 7/3086
10,216,754 B1 * 2/2019 Douglis ............. G06F 16/1744
(Continued)

FOREIGN PATENT DOCUMENTS

EP    3 059 677 A1    8/2016
EP    3 059 677 B1    8/2016
(Continued)

OTHER PUBLICATIONS

Xia et al; "Ddelta: A deduplication-inspired fast delta compression approach"; Performance Evaluation vol. 79, Sep. 2014, pp. 258-272 (Year: 2014).*

(Continued)

*Primary Examiner* — Dennis Truong
(74) *Attorney, Agent, or Firm* — Mintz Levin Cohn Ferris Glovsky and Popeo, P.C.

(57) ABSTRACT

Delta compression method, system and computer program product. Portions of source and target data files are hashed using a hashing function. A target data file is compared against the source data file to determine at least one delta difference between the files. A source data file hashing table is generated. The table includes hashed portions of the source and target data files stored in corresponding source file offset locations and corresponding target file offset locations, respectively. Portions of the source and target files are compared using corresponding source and target file offset locations. At least one common sequence of characters in the portions of the source and target files is determined based on the comparison. A patch file is generated based on the determined sequence of characters.

27 Claims, 11 Drawing Sheets

(58) Field of Classification Search
USPC .................................... 707/693, 640, 747
See application file for complete search history.

(56) References Cited

U.S. PATENT DOCUMENTS

| | | | | |
|---|---|---|---|---|
| 2002/0010702 A1* | 1/2002 | Ajtai | ................ | H03M 7/30 |
| 2005/0219075 A1* | 10/2005 | Storer | ................ | H03M 7/30 |
| | | | | 341/51 |
| 2006/0112264 A1* | 5/2006 | Agarwal | ................ | H03M 7/30 |
| | | | | 713/150 |
| 2006/0184652 A1* | 8/2006 | Teodosiu | ................ | H03M 7/30 |
| | | | | 709/221 |
| 2008/0133561 A1* | 6/2008 | Dubnicki | ................ | G06F 3/0641 |
| 2009/0307251 A1* | 12/2009 | Heller | ................ | G06F 16/174 |
| 2011/0113016 A1* | 5/2011 | Gruhl | ................ | H03M 7/30 |
| | | | | 707/661 |
| 2011/0154169 A1* | 6/2011 | Gopal | ................ | H03M 7/40 |
| | | | | 714/807 |
| 2011/0307447 A1* | 12/2011 | Sabaa | ................ | H04L 67/2842 |
| | | | | 707/637 |
| 2011/0307659 A1* | 12/2011 | Hans | ................ | G06F 3/0613 |
| | | | | 711/114 |
| 2014/0188822 A1* | 7/2014 | Das | ................ | H03M 7/30 |
| | | | | 707/693 |
| 2015/0026567 A1* | 1/2015 | Bots | ................ | H04W 80/06 |
| | | | | 715/242 |
| 2016/0371292 A1* | 12/2016 | Narasimha | ................ | H03M 7/00 |
| 2017/0235496 A1* | 8/2017 | Brosch | ................ | G06F 16/1748 |
| | | | | 707/692 |
| 2018/0205393 A1* | 7/2018 | Guan | ................ | G06F 16/2255 |

FOREIGN PATENT DOCUMENTS

| | | |
|---|---|---|
| WO | WO-2016/087662 A1 | 6/2016 |
| WO | WO-2016/105834 A1 | 6/2016 |

OTHER PUBLICATIONS

R. C. Agarwal, K. Gupta, S. Jain and S. Amalapurapu, "An approximation to the greedy algorithm for differential compression," in IBM Journal of Research and Development, vol. 50, No. 1, pp. 149-166, Jan. 2006, doi: 10.1147/rd.501.0149. (Year: 2006).*

F. B. Chedid and P. G. Mouawad, "On Compactly Encoding With Differential Compression," IEEE International Conference on Computer Systems and Applications, 2006., 2006, pp. 123-129, doi: 10.1109/AICCSA.2006.205078. (Year: 2006).*

A. Molfetas, A. Wirth and J. Zobel, "Storing a Collection of Differentially Compressed Files Recursively," 2014 IEEE International Congress on Big Data, 2014, pp. 88-95, doi: 10.1109/BigData.Congress.2014.22. (Year: 2014).*

European Search Report dated Jun. 14, 2019, for EP Patent Application No. 19156391.5, 11 pages.

* cited by examiner

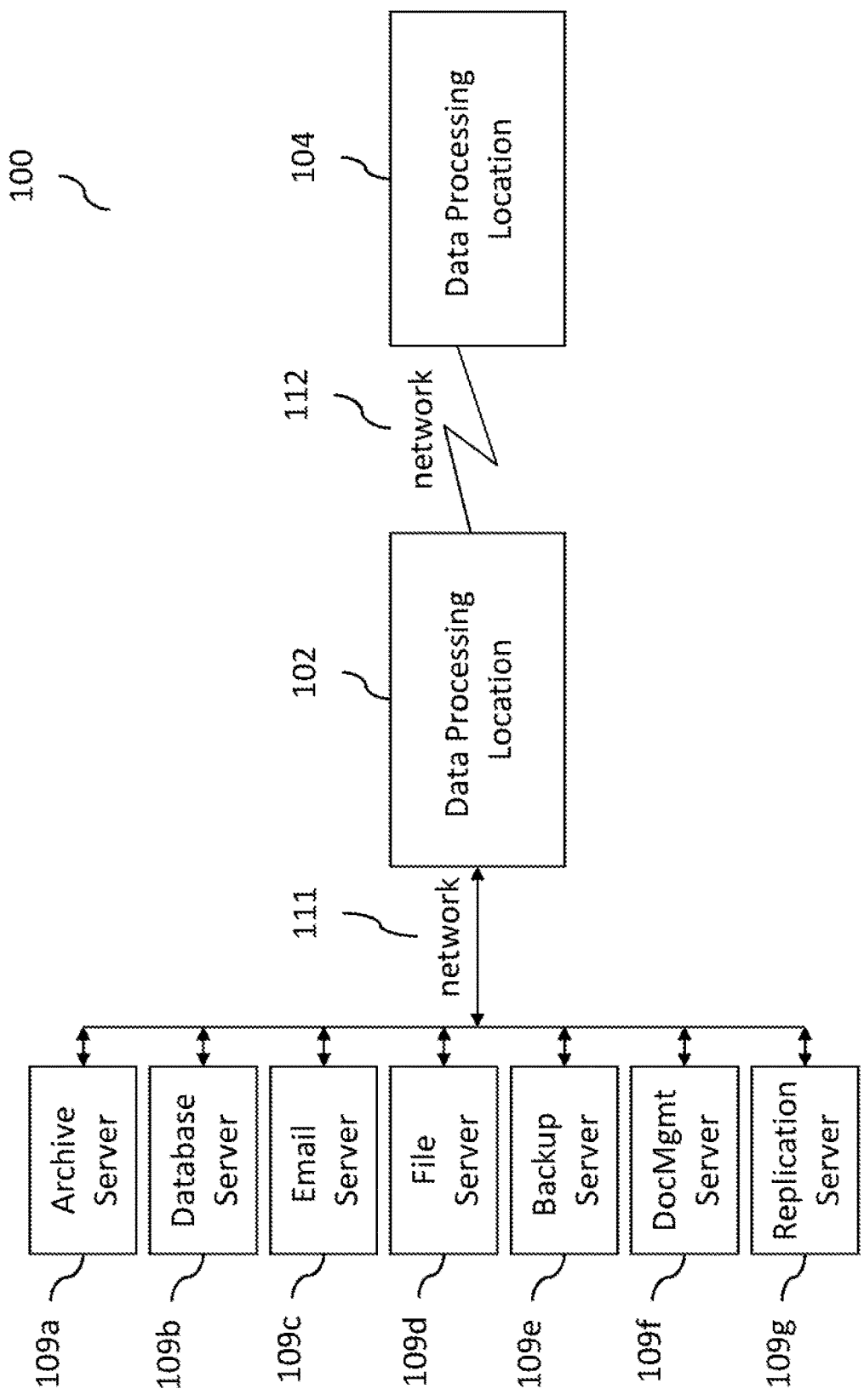

FIG. 5.

| Source File Size | N | Hash Mask | Bits for upper CRC32 (32-N) | Source Hash Table Length | Source Hash Table Size (MiB) |
|---|---|---|---|---|---|
| 4MB | 18 | 0x0003FFFF | 14 | 262,144 | 1 |
| 16MB | 20 | 0x000FFFFF | 12 | 1,048,576 | 4 |
| 64MB | 22 | 0x003FFFFF | 10 | 4,194,304 | 16 |
| 256MB | 24 | 0x00FFFFFF | 8 | 16,777,216 | 64 |

DELTA COMPRESSION

TECHNICAL FIELD

In some implementations, the current subject matter relates to data processing, and in particular, to delta-compression of data.

BACKGROUND

Many information technology ("IT") operations and activities can be scheduled to run one or more times within some periodic cycle (daily, weekly, monthly, quarterly, etc.). One such application can be data backup. Data backups can be essential to preserving and recovery of data in the event of data loss, for example. To avoid interfering with daily user activities, data backups can be performed during periods of low application server utilization, typically, on weeknights and on weekends. The backup job workload can be the same or different depending on how much data needs to be protected and when. In some applications, backup jobs can be scheduled and/or configured using a commercial backup application, an operating system shell scripting, and/or in any other manner.

Backup applications employ a plurality of techniques to manage data designated for backup. One such technique includes delta compression. Delta compression or delta encoding can provide for storage or transmission data in the form of differences or deltas between similar data. Delta compression can also be used for archiving of histories of changes, such as, when new versions of software, documents, etc. are implemented. During delta compression, differences between versions of files are recorded in discrete files called deltas. Use of deltas can significantly reduce consumption of storage space, data redundancy, etc., especially in situations where differences between two files are small (e.g., a change of a few words in a large document, etc.). However, conventional delta compression systems implement compression mechanisms that tend to consume a significant amount of compute power, storage bandwidth, and storage capacity, thereby increasing operational costs and reducing efficiency of networks and data storage facilities. Thus, there is a need for an improved delta compression mechanism that can provide an effective delta compression while reducing storage bandwidth, capacity and amount of computing power involved.

SUMMARY

In some implementations, the current subject matter relates to a computer-implemented method for delta compression. The method can include hashing a portion in a plurality of portions of a source data file using a hashing function. A target data file can be compared against the source data file to determine at least one delta difference between the target data file and the source data file. The method can include generating a source data file hashing table. The source data file hashing table can include a plurality of hashed portions of the source data file. Each hashed portion in the plurality of hashed portions of the source data file can be stored in a corresponding source file offset location in the source data file hashing table, the source data file hashing table being stored in a storage location. The method can also include hashing a portion in a plurality of portions of the target data file. The source data file hashing table can include a plurality of hashed portions of the target data file. Each hashed portion in the plurality of hashed portions of the target data file can be stored in a corresponding target file offset location in the source data file hashing table. Additionally, the method can include comparing the portion in the plurality of portions of the source file to the portion in the plurality of portions of the target file using the corresponding source and target file offset locations, and determining, based on the comparing, at least one common sequence of characters in the portion in the plurality of portions of the source file and the portion in the plurality of portions of the target file. Further, the method can include generating, based on the determining, a patch file having at least one of the following: at least one insert instruction and at least copy instruction, for generating the portion in the plurality of portions of the source file from the portion in the plurality of portions of the target file.

In some implementations, the current subject matter can include one or more of the following optional features. The hashing can include hashing each non-overlapping portion in the plurality of portions of the source data file using the hashing function.

In some implementations, the hashing function can include at least one of the following: a djb2 hashing function and a CRC32 hashing function.

In some implementations, the generation of the source data file hashing table can include applying a first hashing mask to the hashed portion of the source data file, and mapping, based on the applied first hashing mask, the hashed portion of the source data file to the corresponding source file offset location in the source data file hashing table. The corresponding source file offset location can be determined based on a predetermined identifier (e.g., a "block number") corresponding to the portion in the plurality of portions. The predetermined identifier can be stored in the source data file hashing table. The hashing of the portion in the plurality of portions of the target data file can include applying a second hashing mask to the hashed portion of the target data file, and mapping, based on the applied second hashing mask, the hashed portion of the target data file to the corresponding target file offset location in the source data file hashing table.

In some implementations, a size of the source data file hashing table can be determined based on a size of the source data file. The portion in the plurality of portions of the source file can be 16 bytes.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings, FIG. 1 illustrates an exemplary system for processing a stream of data received from a variety of sources, according to some implementations of the current subject matter;

FIG. 2b is a flowchart illustrating a source file encoding process during a delta compression operation shown in FIG. 2a;

FIG. 3b is a flowchart illustrating a target file matching process during a delta compression operation shown in FIG. 3a;

FIG. 5 describes an exemplary determination of a hash mask for various source file sizes, according to some implementations of the current subject matter;

DETAILED DESCRIPTION

Figure 2A:
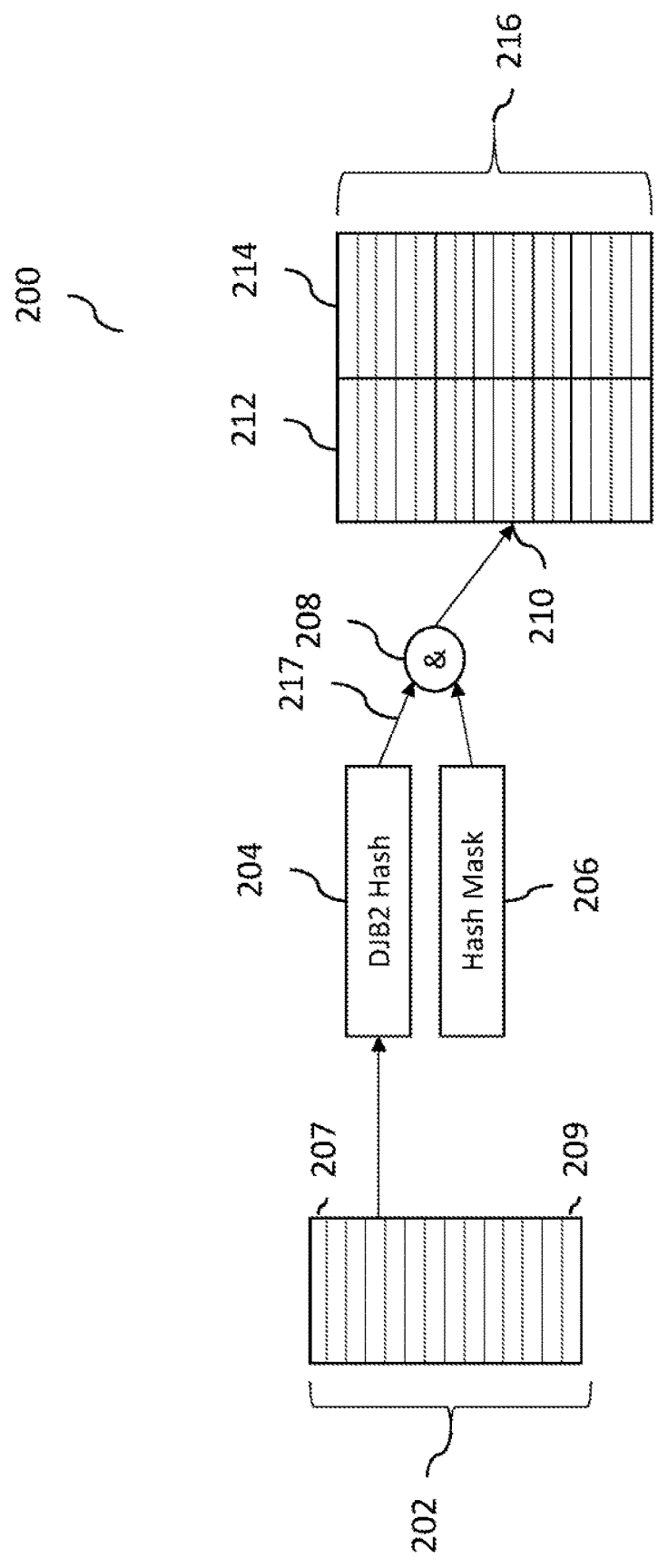
FIG. 2a is a block diagram illustrating an exemplary source file encoding process during a delta compression operation.

To address these and potentially other deficiencies of currently available solutions, one or more implementations of the current subject matter provide methods, systems, articles or manufacture, and the like that can, among other possible advantages, provide for delta-compression of data.

In some implementations, the current subject matter relates to delta compression systems, methods, devices, and/or computer program products. Delta compression can include determination of differences and/or delta encoding between various data (e.g., subsequent, similar, and/or any other versions of data). This can allow for more efficient and/or quicker storage and/or transmission of data between various nodes in a computing system. The determined differences (or deltas) between files, rather than complete files, can be stored/transmitted. In typical applications (as shown in FIG. 1 for example) such as backup, archiving, etc., delta compression can consume significant amounts of CPU (central processing unit) that can be located within data processing location 102, memory and I/O (input/output) resources, and thus slow down performance of a computing system. The current subject matter can minimize utilization of such data processing resources while maximizing compression and/or decompression processing rate and/or compression ratio.

Using delta compression mechanisms, a source file and a target file can be compared to determine their differences. In some exemplary, non-limiting implementations, the target file can be any similar version of the source file (and vice versa). Once the differences are determined, instead of storing and/or transmitting both the source and target files, the target file can be replaced with a (much) smaller patch file.

A patch file can include instructions and data. The instructions can describe how to un-compress the patch file to produce the original uncompressed version data. The data in the patch file can be data which can be dissimilar from the version that the patch file depends on. The patch file can have two instruction types, COPY(offset, length) and INSERT(length, unique data). During un-compression, these instructions can be executed serially from first to last. A COPY instruction can instruct to proceed to the <offset> in the version that the patch depends on in the source file, and copy <length> number of bytes to the uncompressed output file. An INSERT instruction can instruct to take <length> bytes of unique data contained in the target file and write them to the patch uncompressed output file. By executing all patch file instructions in order, an uncompressed output file can be generated which can contain the original uncompressed data from the version (A) which was delta compressed against version (B). Un-compression of the patch file (A) can require uncompressed data from version (B) to satisfy the COPY instructions. Thus, the patch file can contain a "recipe" of how to recreate the target file from its own contents and the source file. If the source file and target file are similar/exact in content, the patch file can be only tens to hundreds of bytes in size, even for very large (e.g., MB, GB . . . ) source and target files.

Delta compression can be characterized by at least the following features: delta compression ratio, delta compression rate, delta decompression rate, and memory footprint. The delta compression ratio refers to how small the resulting patch file is compared to the target file. The delta compression rate refers to how fast the patch file can be generated using the source file and the target file. The delta decompression rate is how fast the target file can be recreated from the source file and the patch file. The memory footprint characteristic refers to how much memory is consumed during execution of the delta compression/decompression operations.

In some implementations, the current subject matter's delta compression processes can be configured to optimize the delta compression rate, reduce the memory footprint during delta compression operations for a backup storage business application, and provide various other benefits. The following FIG. 1 illustrates an exemplary environment where the current subject matter's delta compression processes can be implemented.

FIG. 1 illustrates an exemplary system 100 for processing (e.g., deduplicating, storing, etc.) one or more streams of data received from a variety of sources 109(a, b, c, d, e, f, g). The source 109 can include an archive server 109a, a database server 109b, an email server 109c, a file server 109d, a backup server 109e, a document management server 109f, a replication server 109g, as well as any other application, business object, business process, business process application, server, software, hardware, etc. The system 100 can further include data processing locations 102, 104 and networks 111, 112. The network 111 can communicatively couple the data processing location 102 and source 109 and the network 112 can communicatively couple the data processing location 102 and the data processing location 104. In some implementations, the data processing location 102 can be located in the same physical location as the sources 109. Alternatively, the data processing location 102 can be remote from the sources 109. The data processing location 104 can be remotely located from the sources 109 and/or data processing location 102. For example, the data processing location 104 can be a recovery site for the data received from the source 109.

The data processing locations 102 and/or 104 can include one or more computing devices, systems, servers, hardware, software, and/or any combination of hardware and/or software, which can be communicatively coupled with one another using various wireless and/or wired connections, networks, etc. The networks 111, 112 can be any wireless and/or wired networks, wide area networks ("WAN"), metropolitan area networks ("MAN"), local area networks ("LAN"), Internet, extranet, intranet, as well any other type of network.

In some embodiments, the data processing location 102 can receive data stream(s) from sources 109 and can perform an initial processing (e.g., deduplication, delta-compression, data compression, analysis, etc.) of the received data. Additionally, the data processing location 102 can also perform retrieval of data, when requested to do so by source(s) 109. The data can be stored in a storage local to the data processing location 102 (not shown in FIG. 1). The data can be sent to data processing location 104 and stored in a storage local to the data processing location 104 (not shown in FIG. 1). For example, critical application data can be stored at a local facility (e.g., as represented by the data processing location 102) and/or at a geographically distant remote facility (e.g., as represented by the data processing location 104) in order to provide for a full recovery in the event of system failure, site disaster, or any other unprecedented condition or event.

During a delta compression operation, which can be performed by the data processing location 102 (and/or 104), byte-by-byte comparisons between the source and target files can be performed to identify different and/or common bytes. However, such process can be time-consuming, compute-intensive, etc. Thus, hashing and/or encoding techniques can be used to expedite comparison process, as shown in FIGS. 2a-5.

FIG. 2a is a block diagram illustrating an exemplary conventional source file encoding process 200 during a delta compression operation. The process 200 can perform encoding of a source file 202, as shown in FIG. 2a. By way of a non-limiting example, the source file 202 can be approximately 16 MB in size. As can be understood, any other size files can be used. The source file 202 can include one or more data blocks and/or sections 207, 209, where data block 207 can designate a beginning of the source file 202 and data block 209 can designate an end of the source file 202. For example, each data block can be 16 bytes in size.

As shown in FIG. 2a, for the purposes of delta-compression, a hash function (e.g., a djb2 hash function) 204 can be used to encode data in the source file 202. The hash function 204 can produce a hash value 217 (e.g., if djb2 hash function is used, it can generate a small 32-bit hash value 217 and can be used to support efficient fixed block and/or rolling hash implementations).

As stated above, the source file 202 can be processed first by generating a hash value 217 (e.g., a 32-bit djb2 hash) for every non-overlapping data block (e.g., 16-bytes) of the source file 202. The source file 202 can then be processed from the last data block 209 (e.g., 16-bytes) of the source file 202 to the beginning data block 207 of the source file 202. By way of example, a source file that is 16 MB (16,000,000 bytes) in size can encode exactly 1,000,000 16-byte blocks. The nearest power of 2 that can contain 1,000,000 is 1,048,576, which is $2^{20}$. The hash function 204 can generate the source hash value 217, which can be used to populate a source hash table 216 having 1,048,576 entries. In order to map the hash into the source hash table 216, a mask 206 having low N bits of the hash value 217 can be applied to the hash value 217 to provide an offset address into the source hash table 216. For this example, since the source hash table 216 has 1,048,576 bytes, the mask 206 that is applied to the hash value 217 can be an AND Boolean operation 208 of the low 20 bits (e.g., 0x000FFFFF) of the hash value 217 to generate the offset address 210 into the source hash table 216. At that offset address 210, the source file byte offset+1 can be stored in high 4 bytes 212 of the source hash table 216 entry. The offset+1 can be stored in the source hash table 216 so that an offset of 0 can represent a "no match" entry with no matching hash from the source file 202. The source hash table 216 can also store the first 4 bytes data block 207 of the source file 202 into the low 4 bytes 214 of the source hash table 216 to expedite later matching. For example, a processing of a 16 MB source file can result in a hash table of 8 MB (i.e., 1,048,576 entries multiplied by 8 bytes/entry).

If multiple source file blocks 207, 209 are hashed into the same source hash table entry 210, the entry can include information for the last block processed. The source file 202 can be processed from the end of the file to the beginning of the file, so when multiple blocks 207, 209 hash to the same entry 210 in the source hash table 216, the entry can store information 212, 214 about the block with the lowest offset.

Figure 2B:
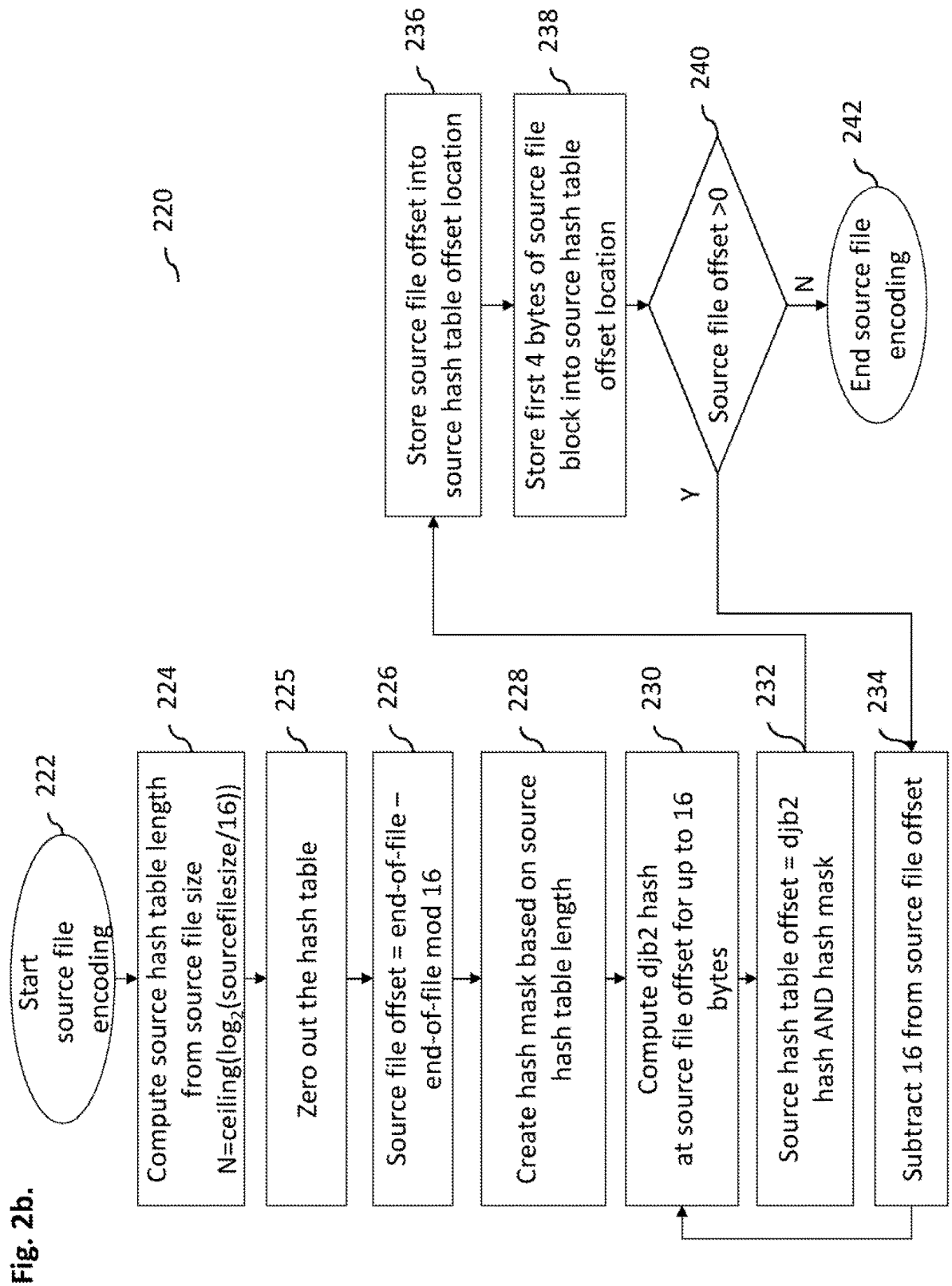

FIG. 2b is a flowchart illustrating a conventional source file encoding process 220 during a delta compression operation shown in FIG. 2a, whereby the source file 202 is encoded into the source hash table 216. At 222, the source file encoding process can be initiated. At 224, a source hash table length can be determined (or computed) using the size of the source file 202. This can be determined using the following expression: N=ceiling($\log_2$(sourcefilesize/16)). At 225, the source hash table can be zeroed out (e.g., all entries set to 0). At 226, the source file offset can be determined using a difference between end-of-file and end-of-file modulo 16. At 228, a hash mask can be created based on the source hash table length. At 230, a hash (e.g., a djb2 hash) value 217 can be computed at source file offset (e.g., for up to 16 bytes). At 232, a source hash table offset can be determined using the calculated hash value 217 and a hash mask (e.g., using an AND Boolean operation). The source file offset 210 can be stored into the source hash table 216 column 212, at 236. The first bytes (e.g., first 4 bytes) of the source file block can then be stored into the source hash table 216 column 214, as shown in FIG. 2a, at 238.

At 240, a determination is made whether source file offset is greater than zero. If not, the source file encoding process can terminate, at 242. Otherwise, a predetermined number of bytes (e.g., 16 bytes) can be subtracted from the source file offset, at 234. The process 220 can then return to computing the hash value, at 230.

Figure 3A:
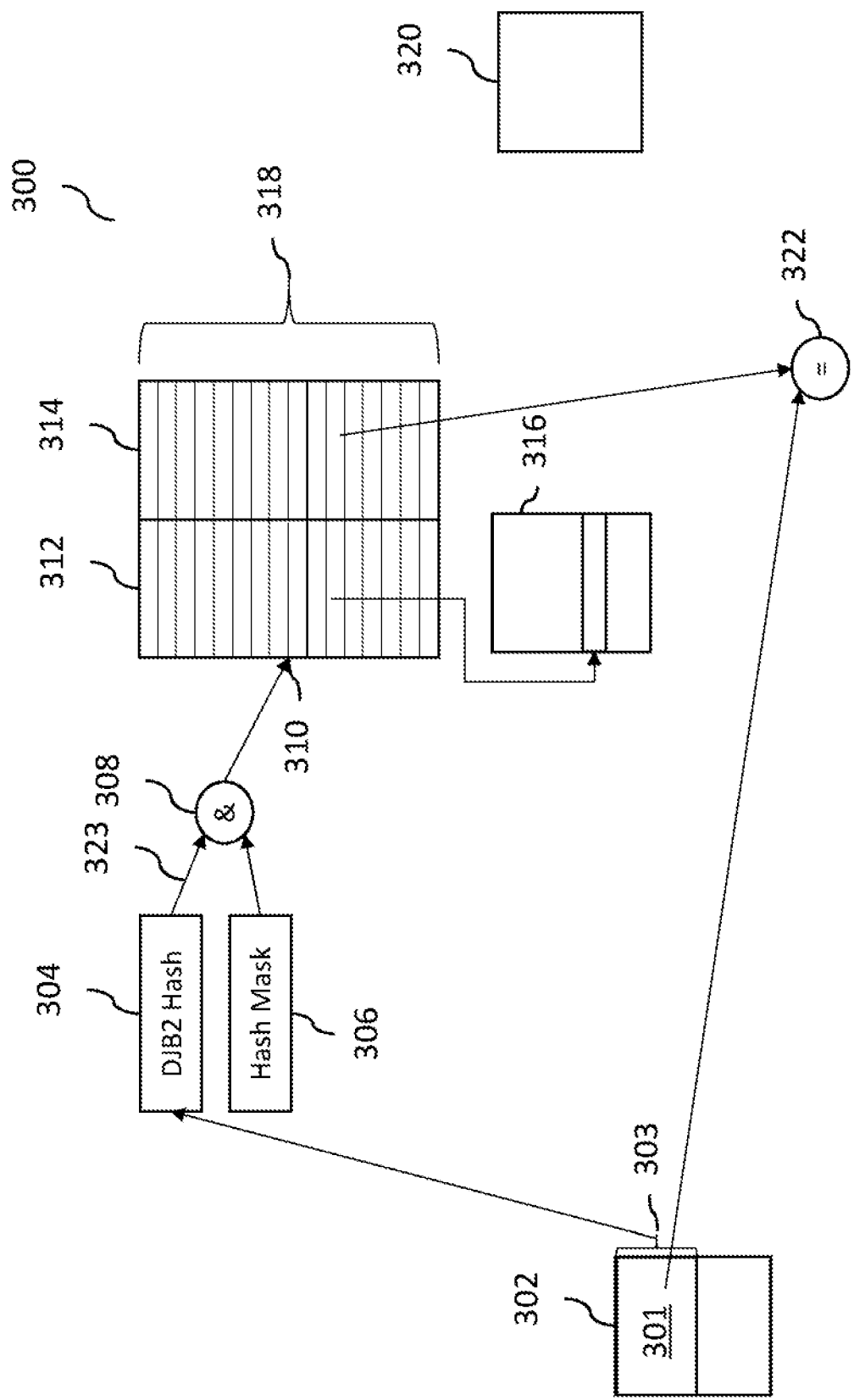
FIG. 3a is a block diagram illustrating a target file matching process during a delta compression operation.

FIG. 3a is a block diagram illustrating a conventional target file matching process 300 during a delta compression operation. In particular, the process 300 can be configured to generate a patch file 320 for the purposes of performing delta compression/uncompression. The patch file 320 can be generated by comparing hash values 323 (e.g., djb2 hashes) of the target file 302 against the source hash table 318, comparing bytes in a matched region to create COPY instructions for the patch file 320, and encoding mismatches as INSERT instructions with unique bytes for the patch file 320.

In order to detect identical data blocks (e.g., 16 byte blocks) between the source file 316 and target file 302, the target file 302 can be scanned from the beginning of the file to the end of the file. A hash value 323 (e.g., djb2 hash) can be used to determine matches for every overlapping data block (e.g., 16 byte blocks) 303 between the source file 316 and the target file 302 even when a source block (e.g., 16-byte block) offset may not match to the same target block (e.g., 16-byte block) offset. Each overlapping 16-byte target file block 303 can be encoded using the hash function 304 (e.g., djb2 hash), and the resulting hash value 323 can be masked using a hash mask 306 to identify an offset 310 within the source hash table 318. Each entry in the source hash table 318 can include a source file offset+1 value 312 and first 4 bytes 314 of the source file 316 for that target block.

If the offset+1 value 312 is zero at the source file hash table offset, this can indicate that no blocks of the source file 316 match this target file's hash value 323. If the offset+1 value 312 is not zero, this can indicate that the hash of a block of the source file 316 and the hash value 323 of the target file 302 at their respective offsets can have the same lower N bits of the hash value 323. In some exemplary implementations, because djb2 hash function is a relatively weak hash function, it is not a guarantee that the 16-bytes of the source block and target block will actually match.

Subsequently, the first 4 bytes of the block 301 of the target file 302 can be compared to the first 4 bytes 314 stored in the source hash table 318. If they don't match (as shown at 322), the source file 316 and target file 302 blocks are not processed byte by byte to identify identical bytes. If the first 4 bytes 314 of the source hash table 318 entry match (at 322) the first 4 bytes 301 of the target file 302 block, then the bytes in the source block and target block that matched can be compared. The offset of the source file 316 entry can be decreased by 1 since that reflects the true offset in the source file 316. By comparing bytes both forward and backward from the first 4 matched bytes 301, the maximum number of sequential matching bytes can be identified to be later encoded in the patch file as a COPY instruction.

As the target is processed further, it generates two kinds of instructions in the patch file 320. One of the instructions can be a COPY instruction and the other can be an INSERT instruction. The COPY instruction can contain a largest possible contiguous range of bytes from the source file 316 that match the same length range of bytes in the target file 302 (e.g., at a different and/or same file offset) that are encoded in the patch file 320 by saving the source file offset and length of the matched bytes. The INSERT instruction can contain bytes of the target file 302 that can be unique and/or were not found to match the source file and that can be copied directly to the patch file 320 as a sequence of bytes. Once the generation of the patch file is completed, the delta compression process can perform data compression of the contents of the patch file 320 (e.g., using a zlib data compression, and/or any other data compression mechanism).

Figure 3B:
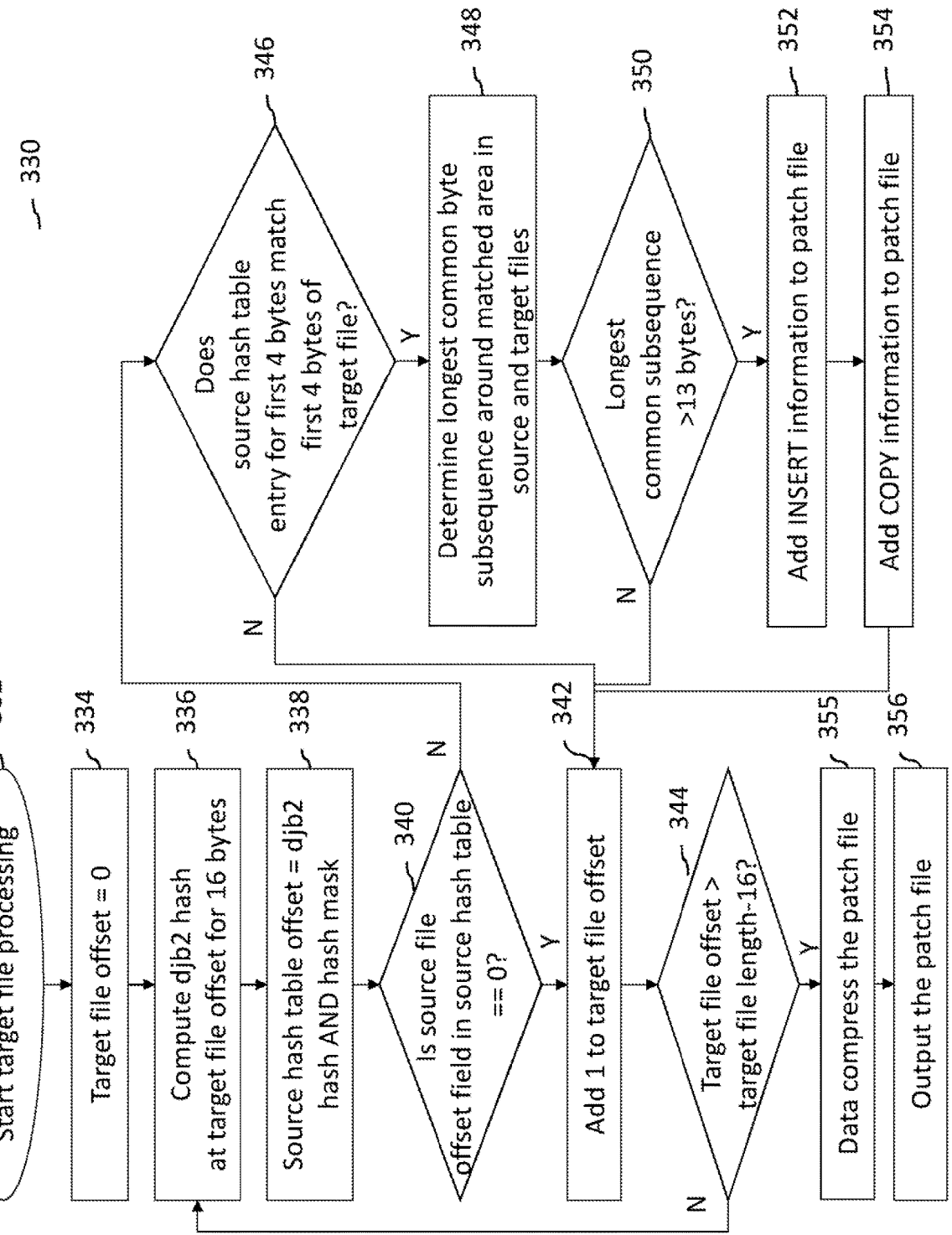

FIG. 3b is a flowchart illustrating a conventional target file matching process 330 during a delta compression operation 300 shown in FIG. 3a. At 332, the target file processing can be initiated. At 334, the offset of the target file 302 can be set to zero. Then, a hash value 323 (e.g., djb2 hash value) can be determined at the target file offset for a data block (e.g., 16 bytes), at 336. At 338, a source hash table offset is determined using Boolean AND of a hash value (e.g., a djb2 hash value) and a hash mask 306.

At 340, a determination is made whether source file offset field 312 in the source hash table is equal to zero. If so, one is added to the target file offset, at 342. If the new target file offset is greater than the target file length minus the size of the data block (e.g., 16), at 344, the processing of the target file ends, at 356. Otherwise, the process 330 returns to compute new hash at the target file offset for a new data block (e.g., 16 bytes), at 336.

If the source file offset field in the source hash table is not equal to zero, at 340, the process 330 can determine whether source hash table entry for the first predetermined number of bytes (e.g., 4 bytes) match the first predetermined number of bytes (e.g., 4 bytes) in the target file. If not, one is added to the target file offset, at 342. If so, the longest common byte subsequence around matched area in the source and target files is determined, at 348. If the common byte subsequence is greater than a predetermined number of bytes (e.g., 13 bytes), at 350, then an INSERT instruction is added to the patch file 320, at 352, and a COPY instruction is added to generate the patch file 320, at 354 and output it, at 356, which can include data compression of the patch file. Then, the process returns to operation 342 to add one to the target file offset. If the common byte subsequence is not greater than the predetermined number of bytes (e.g., 13 bytes), at 350, the process 330 also returns to operation 342 to process next target file offset.

Figure 4A:
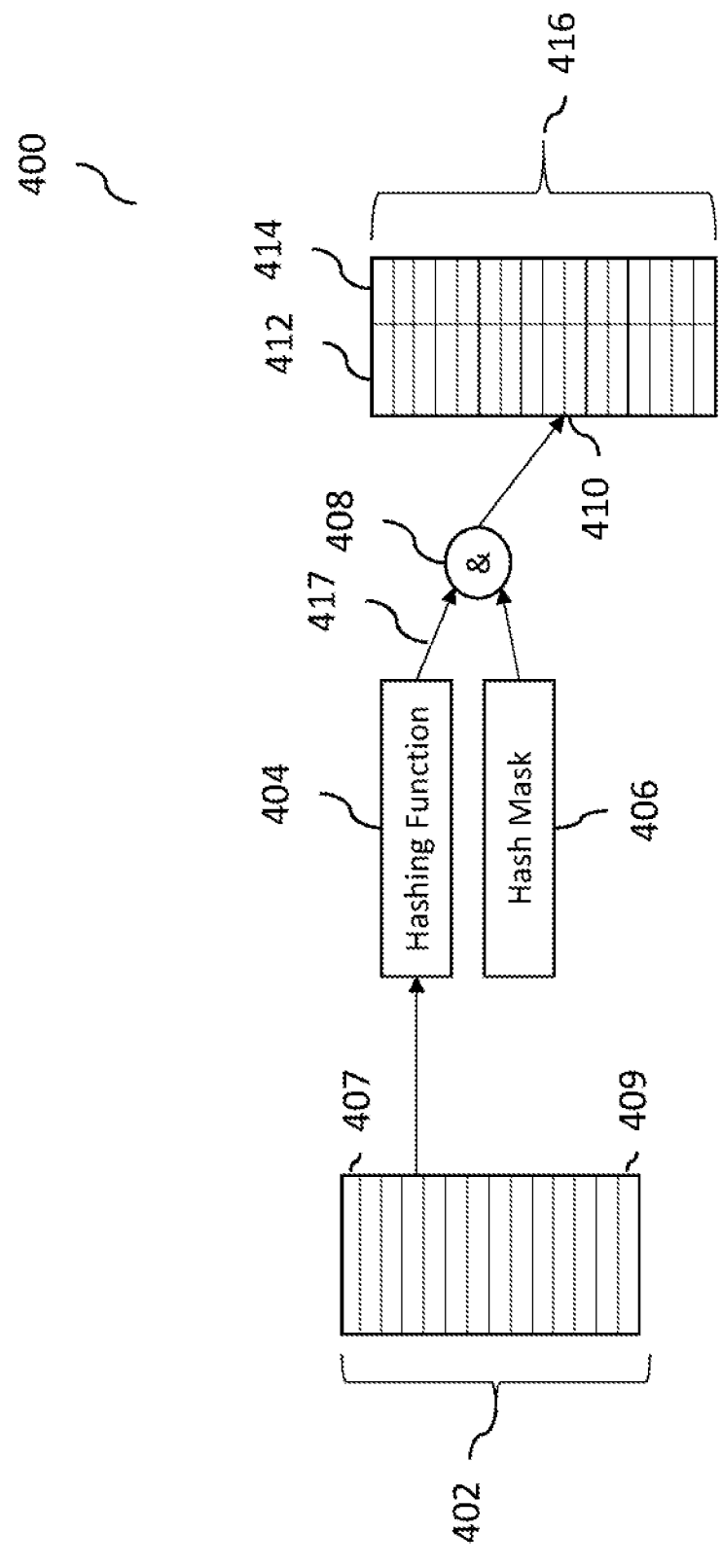
FIG. 4a is a block diagram illustrating a source file encoding process during a delta compression operation, according to some implementations of the current subject matter.

FIG. 4a is a block diagram illustrating an exemplary source file encoding process 400 during a delta compression operation, according to some implementations of the current subject matter. The process 400 implements an improved hash process. Further, the current subject matter's process 400 can improve delta-compression rate and speed, reduce memory footprint, reduce consumption of computing resources, as well as improve overall effectiveness and efficiency of delta-compression. Some of the conventional hashes (e.g., djb2 hash) can be weak hashes with a higher possibility of hash collisions. These hash collisions can waste valuable processing time in attempting to match source and target blocks, which might not actually match. The current subject matter's process 400 includes a stronger hashing function that can reduce the probability of hash collisions. In various applications, such as a backup deduplication, millions of delta compression operations must be performed every day, the current subject matter's process 400 improves delta compression rate of processing. Further, the process 400 can also reduce memory footprint of the source hash table to allow more delta compression operations to be performed in parallel in the same memory space.

In some exemplary implementations, the process 400 can implement various hashing functions. By way of a non-limiting example, a CRC32 hashing function along with the SSE4.2 Streaming SIMD Extensions, as developed by Intel Corporation. The CRC32 hashing function can be 7.3 times faster than some conventional hashing functions (e.g., djb2 function) in performing a source file block hash, and 1.6 times faster in performing a target file rolling hash. The CRC32 hashing function can be used either by itself or in combination with other hashing algorithms (e.g., when slower or older data processing locations may be involved).

The CRC32 hashing function can determine a hash value using the following:

$$\text{hash}=\text{crc32\_8 byte}(\text{crc32\_8 byte}(0,1^{st}\text{ 8 bytes}),2^{nd}\text{ 8 bytes}) \quad (1)$$

As shown in FIG. 4a, the process 400 can perform delta-compression using a source file 402. By way of a non-limiting example, the source file 402 can be approximately 16 MB in size. As can be understood, any other size files can be used. The source file 402 can include one or more data blocks and/or sections 407, 409, where data block 407 can designate a beginning of the source file 402 and data block 409 can designate an end of the source file 402. For example, each data block can be 16 bytes in size.

As shown in FIG. 4a, for the purposes of delta-compression, a hash function 404 (e.g., a CRC32 hash function, and/or any other function) can be used to encode data in the source file 402. The hash function can produce a hash value 417. The source file 402 can be processed by generating the hash value 417 for every non-overlapping data block (e.g., 16-bytes) of the source file 402. The source file 402 can then be processed from the last data block 409 (e.g., 16-bytes) of the source file 402 to the beginning data block 407 of the source file 402. The hash value 417 can be used to populate a source hash table 416.

In some exemplary, non-limiting implementations, if the hash value 417 is a CRC32 hash, the width of the source hash table 416 can be reduced from 8 bytes to 4 bytes per entry. Each entry in the source hash table 416 can be first initialized to an "impossible" value of "0xFFFFFFFF" (which ensures that it is not a valid entry for the purposes of encoding the lower bits of the hash into the source hash table 416 entry). In some implementations, the size of the source hash table 416 can be $2^N$, where N=ceiling($\log_2$(SourceFileSize/16)+1)). This can ensure that the highest offset in the table 416 is never used and thus, 0xFFFFFFFF is guaranteed to be an impossible value.

The hash value 417 can be masked using a hash mask 406 and a Boolean AND operation 408 can be used to combine the hash value 417 and the hash mask 406 to the same number of bits as shown was in connection with the process 200 shown in FIG. 2a in order to determine an offset 410 in the source hash table 416.

By way of a non-limiting example where the hashing function 404 is a CRC32 hashing function discussed above, assuming that the size of the source file 402 is 16 MB, the number of 16-byte blocks in the source file 402 can be 1,000,000. The CRC32 hash value 417 does not store an exact offset of the source file in the source file table 416 entry, but instead uses a "block number" corresponding to the offset, which can be later determined as the block number times 16. Thus, to store block numbers 0-999,999, only 20 bits of each source hash table 416 entry can be required (each entry in the source hash table 416 can be 32 bits). The block numbers can be stored in the low 20-bits of the source hash table entry 414. Since the source hash table 416 width can be set to 32-bits, 12 additional bits of storage 412 can be used to store high 12 bits of the CRC32 hash value 417. From these two fields in the source hash table 416 and a source hash table index, the source file offset and source file hash can be determined using the following:

$$\text{Source file offset}=(\text{hashTableEntry AND 0xFFFFF})*16 \quad (2)$$

The low N bits of the source hash table 416 can store the 16-byte block number for that source hash table entry. The offset in the source file can be derived by multiplying the N-bit masked hashTableEntry by 16, as shown above.

$$\text{Source file hash}=(\text{hashTableEntry AND 0xFFF00000})\text{OR sourceHashIndex} \quad (3)$$

The entire CRC32 hash value of the 16 byte source file block can be derived by merging the N bits of the source hash index 410 with the 32-N high bits of the CRC32 hash. Further, because the source hash table 416 has a width of 32 bits, a plurality of sizes of source files can be accommodated.

Figure 4B:
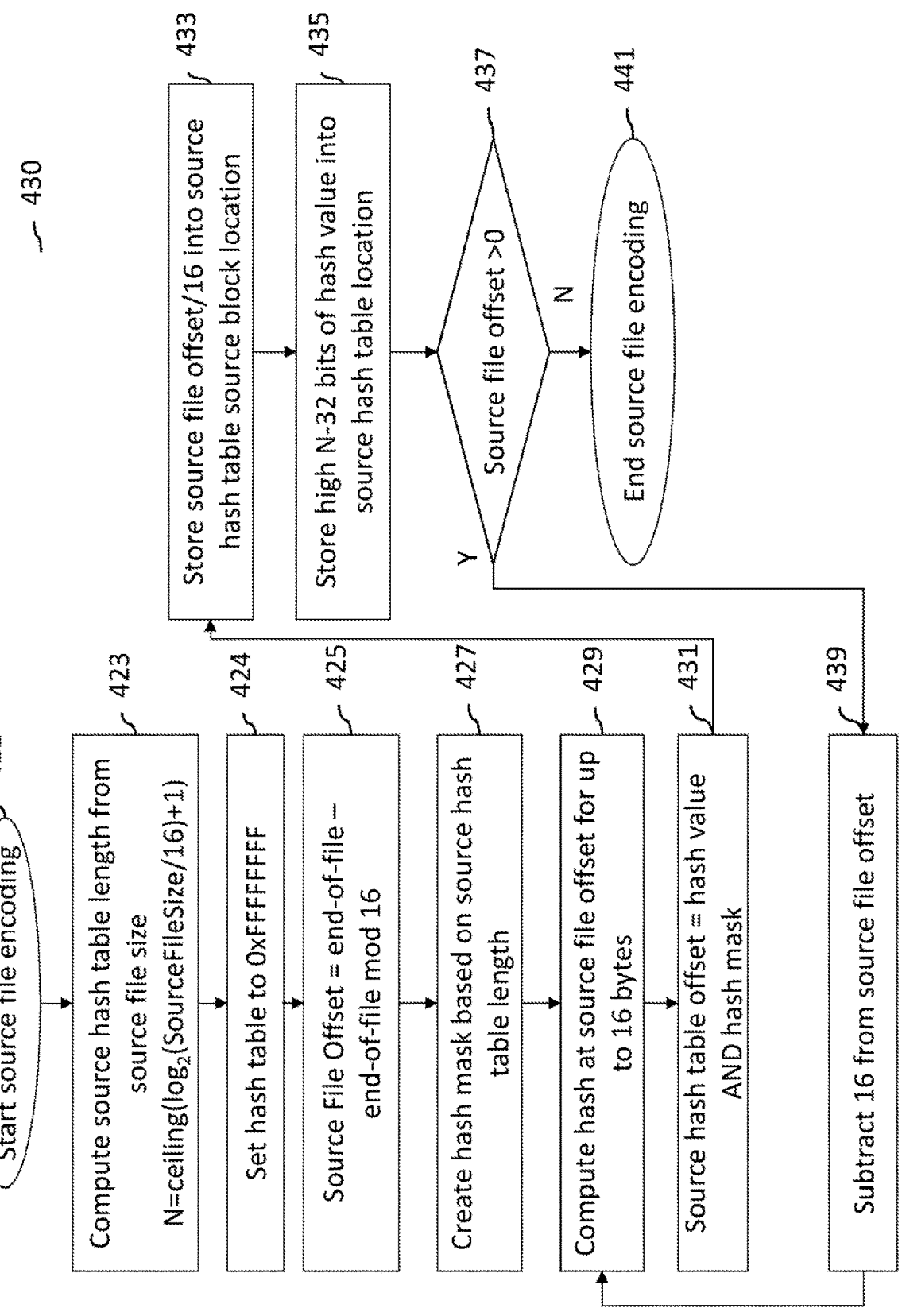
FIG. 4b is a flowchart illustrating a source file encoding process during a delta compression operation shown in FIG. 4a, according to some implementations of the current subject matter.

FIG. 4b is a flowchart illustrating an exemplary source file encoding process 430 during a delta compression operation shown in FIG. 4a, whereby the source file 402 is encoded into the source hash table 416, according to some implementations of the current subject matter. At 421, the source file encoding process can be initiated. At 423, a source hash table length can be determined (or computed) using the size of the source file 402. This can be determined using the following expression: N=ceiling($\log_2$(sourcefilesize/16)+1). At 424, the source hash table can be initialized (i.e., all entries are set to 0xFFFFFFFF). At 425, the source file offset can be determined using a difference between end-of-file and end-of-file modulo 16. At 427, a hash mask 406 can be created based on the source hash table length. At 429, a hash value 417 (e.g., a CRC32 hash value) can be computed at source file offset (e.g., for up to 16 bytes). At 431, a source hash table offset can be determined using the calculated hash value 417 (e.g., CRC32 hash value) and a hash mask 406 (e.g., using an AND Boolean operation). The source file offset can be stored into the source hash table 416 source block location 412, at 433. The high N-32 bits of the hash can then be stored into the source hash table location 414, as shown in FIG. 4a, at 435.

At 437, a determination can be made whether source file offset is greater than zero. If not, the source file encoding process can terminate, at 441. Otherwise, a predetermined number of bytes (e.g., 16 bytes) can be subtracted from the source file offset, at 439. The process 430 can then return to computing the hash value, at 429.

Figure 4C:
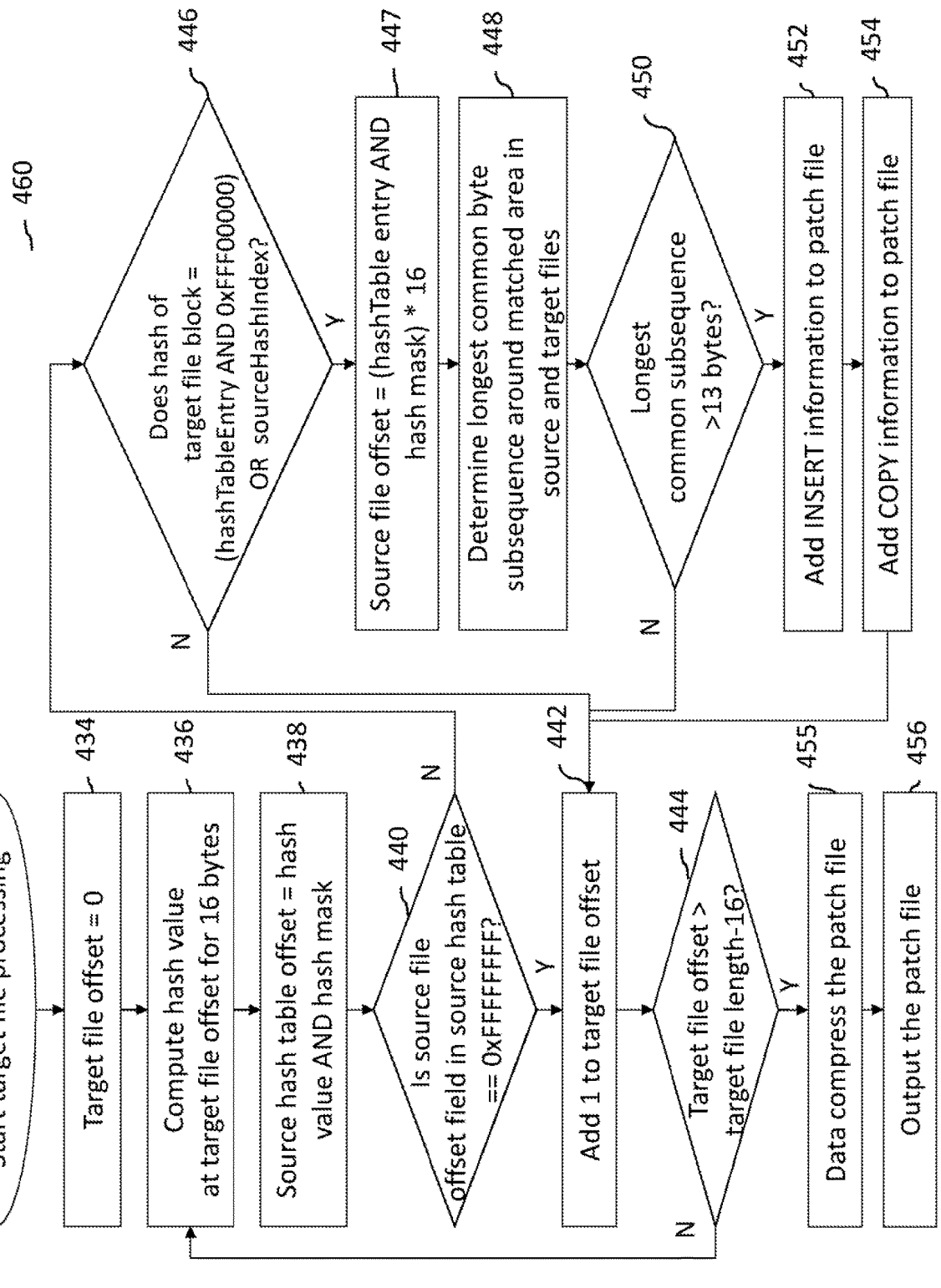
FIG. 4c is a flowchart illustrating a target matching process during a delta compression operation, according to some implementations of the current subject matter.

FIG. 4c is a flowchart illustrating an exemplary target matching process 460 during a delta compression operation, according to some implementations of the current subject matter. At 432, target file processing can be initiated. At 434, the offset of the target file can be set to zero. Then, a hash value (e.g., CRC32 hash value) can be determined at the target file offset for a data block (e.g., 16 bytes), at 436. At 438, a source hash table offset can be determined using Boolean AND operation of the hash value (e.g., a CRC32 hash value) and the hash mask.

At 440, a determination can be made whether source file offset field in the source hash table is equal to 0xFFFFFFFF (i.e., an impossible entry). If so, one is added to the target file offset, at 442. If the new target file offset is greater than the target file length minus the size of the data block (e.g., 16), at 444, the processing of the target file proceed to generate a patch file (which can include data compression of the patch file), at 455 and outputting the patch file, at 456. Otherwise, the process 460 returns to compute new hash value at the target file offset for a new data block (e.g., 16 bytes), at 436.

If the source file offset field in the source hash table is not equal to 0xFFFFFFFF, at 440, the process 460 can determine whether the hash value (e.g., CRC32 hash value) of the target file block is equal to (hashTableEntry AND 0xFFF00000) OR sourceHashIndex, at 446. If not, one is added to the target file offset, at 442. If so, the source file offset can be determined based on the hash table entry and hash mask (e.g., (hashTableEntry AND hash mask)*16), at 447. Then, the longest common byte subsequence around matched area in the source and target files can be determined, at 448. If the common byte subsequence is greater than a predetermined number of bytes (e.g., 13 bytes), at 450, then an INSERT instruction is added to the patch file, at 452, and a COPY instruction is added to the patch file, at 454. Then, the process returns to operation 442 to add one to the target file offset. If the common byte subsequence is not greater than the predetermined number of bytes (e.g., 13 bytes), at 450, the process 460 can return to operation 442 to process next target file offset.

FIG. 5 illustrates an exemplary determination table 500 of a hash mask for various source file sizes, according to some implementations of the current subject matter. By way of a non-limiting exemplary, implementation, the table 500 illustrates results when CRC32 hashing function, described above, is used. The table 500 can include a source file size column 502, a width N column 504, a hash mask column 506, a higher hash bits (bits for upper CRC32 (32-N)) column 508, a source hash table length column 510, and a source has table size (e.g., in mebibytes (MiB)) column 512. The table 500 shows a range of example source file sizes 502 that can represent low to high ranges of source files for a backup storage application. Column 504 can further define the width N of the CRC32 mask 506 that can points to an entry in the source hash table column 510. N can be determined based on the source file size shown in column 502 as follows:

$$N=\text{ceiling}(\log_2((\text{sourceFileSize}/16)+1))\quad(4)$$

The number of bits to select a source hash table entry (low N bits of CRC32) plus the number of bits NOT required for the index (high 32-N bits of CRC32), can always add up to 32 bits. When a match between the masked target file CRC32 and the masked source hash table entry is made, the entire 32-bit CRC32 value can be computed to allow the full CRC32 of the 16-byte source block to be compared against the full CRC32 of the 16-byte target block before proceeding with compute intensive byte comparisons.

Figure 6:
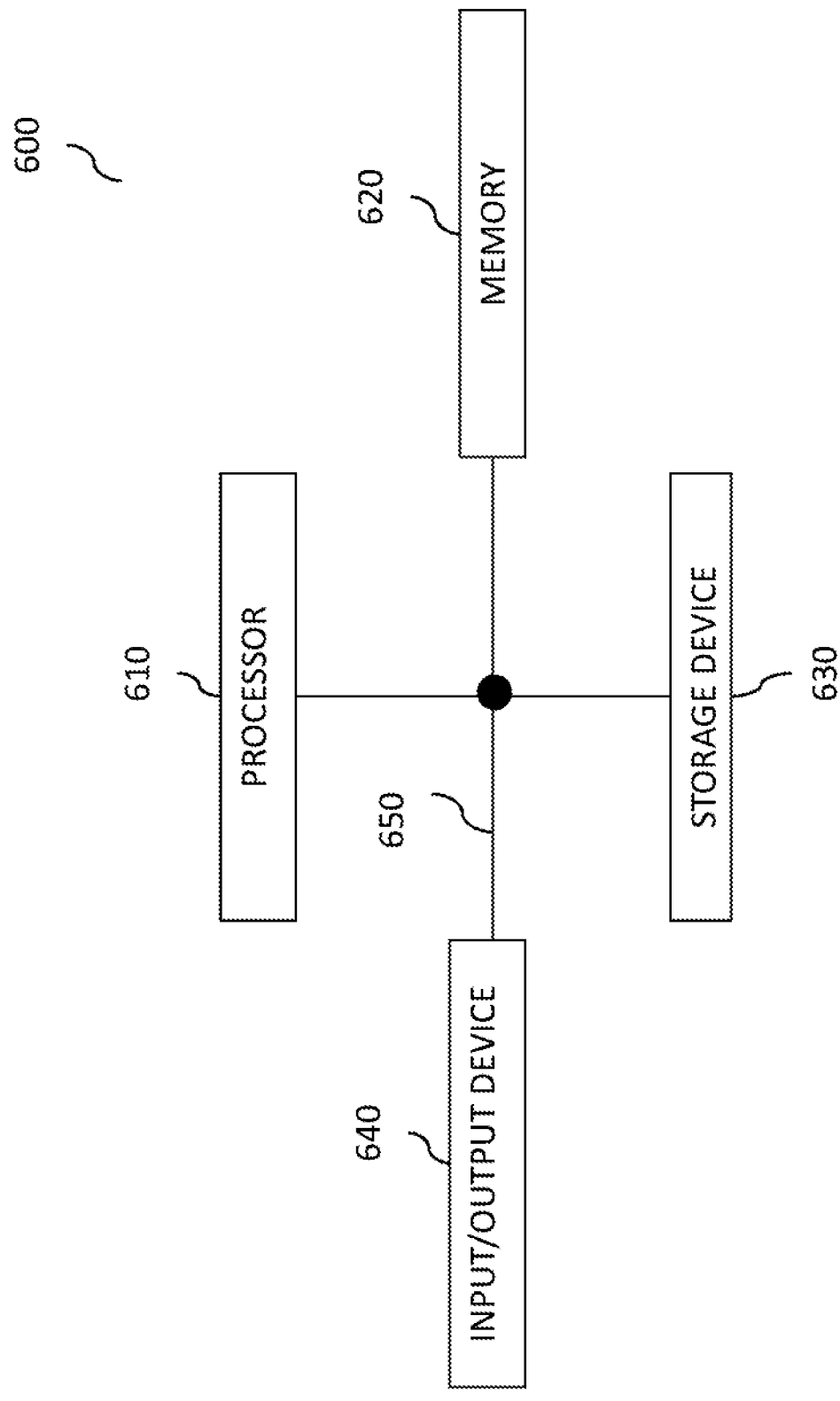
FIG. 6 illustrates an exemplary system, according to some implementations of the current subject matter.

In some implementations, the current subject matter can be configured to be implemented in a system 600, as shown in FIG. 6. The system 600 can include a processor 610, a memory 620, a storage device 630, and an input/output device 640. Each of the components 610, 620, 630 and 640 can be interconnected using a system bus 650. The processor 610 can be configured to process instructions for execution within the system 600. In some implementations, the processor 610 can be a single-threaded processor. In alternate implementations, the processor 610 can be a multi-threaded processor. The processor 610 can be further configured to process instructions stored in the memory 620 or on the storage device 630, including receiving or sending information through the input/output device 640. The memory 620 can store information within the system 600. In some implementations, the memory 620 can be a computer-readable medium. In alternate implementations, the memory 620 can be a volatile memory unit. In yet some implementations, the memory 620 can be a non-volatile memory unit. The storage device 630 can be capable of providing mass storage for the system 600. In some implementations, the storage device 630 can be a computer-readable medium. In alternate implementations, the storage device 630 can be a floppy disk device, a hard disk device, an optical disk device, a tape device, non-volatile solid state memory, or any other type of storage device. The input/output device 640 can be configured to provide input/output operations for the system 600. In some implementations, the input/output device 640 can include a keyboard and/or pointing device. In alternate implementations, the input/output device 640 can include a display unit for displaying graphical user interfaces.

Figure 7:
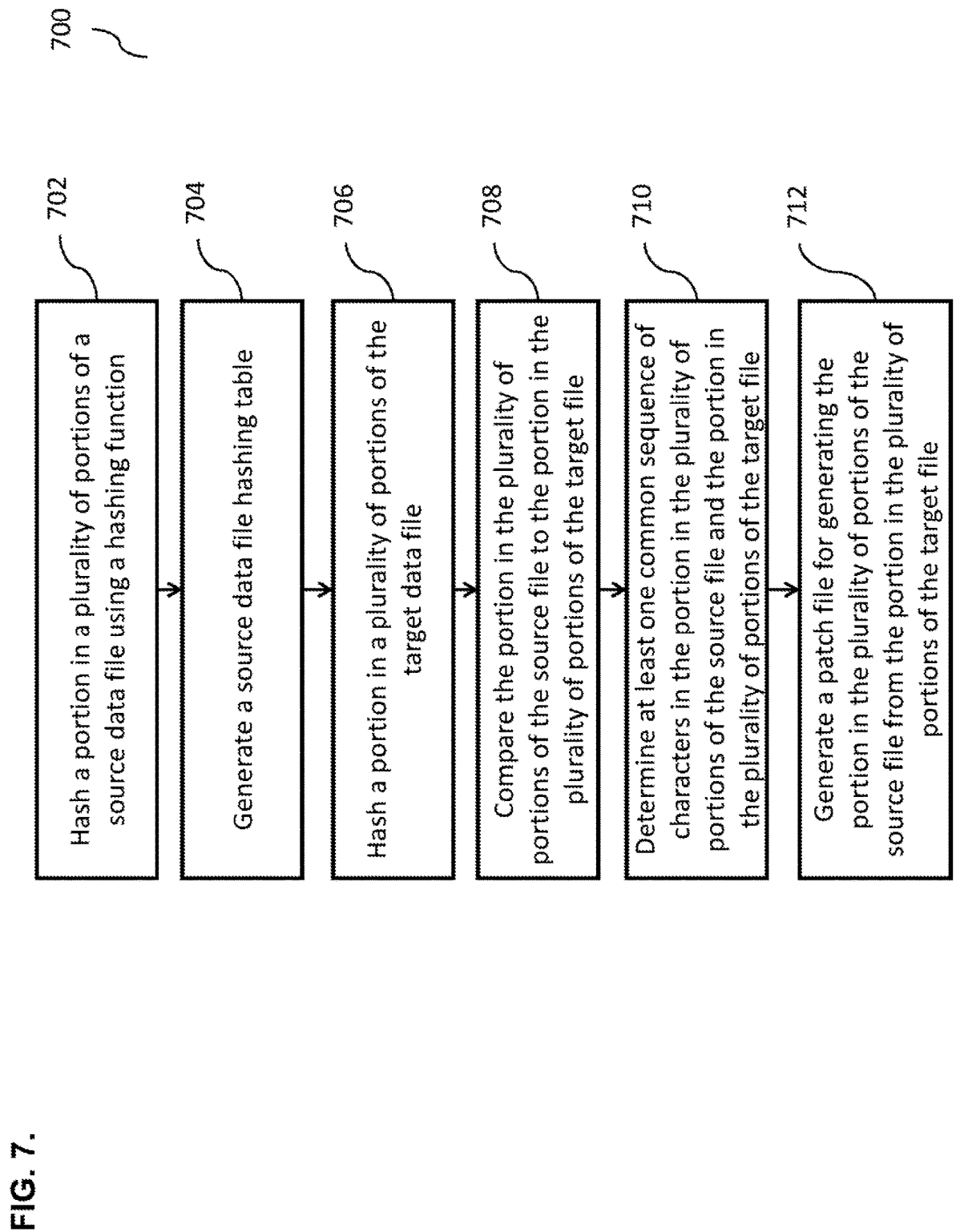
FIG. 7 illustrates an exemplary method, according to some implementations of the current subject matter.

FIG. 7 illustrates an exemplary process 700 for performing delta-compression, according to some implementations of the current subject matter. At 702, a portion in a plurality of portions of a source data file can be hashed using a hashing function (e.g., hashing function 404 as shown in FIG. 4a). In some implementations, a target data file can be compared against the source data file to determine at least one delta difference between the target data file and the source data file, such as during a delta compression operation. At 704, a source data file hashing table (e.g., source data file hashing table 416) can be generated. The source data file hashing table can include a plurality of hashed portions of the source data file. Each hashed portion in the plurality of hashed portions of the source data file can be stored in a corresponding source file offset location (e.g., location 410 as shown in FIG. 4a) in the source data file hashing table. The source data file hashing table can be stored in a storage location (e.g., a memory location, a cloud, a server, etc.). At 706, a portion in a plurality of portions of the target data file can be hashed (as shown in FIG. 4c, at 436). The source data file hashing table can include a plurality of hashed portions of the target data file. Each hashed portion in the plurality of hashed portions of the target data file can be stored in a corresponding target file offset location (e.g., location 414, as shown in FIG. 4a) in the source data file hashing table. At 708, the portion in the plurality of portions of the source file can be compared to the portion in the plurality of portions of the target file using the corresponding source and target file offset locations, such as to determine whether there are any matching sequences of data (e.g., as shown in FIG. 4c, at 448). At 710, at least one common sequence of characters in the portion in the plurality of portions of the source file and the portion in the plurality of portions of the target file can be determined based on that comparison. At 712, a patch file having at least one of the following: at least one insert instruction and at least copy instruction can be generated (e.g., as shown in FIG. 4c, at 452, 454). The patch file can be data compressed and then used for generating the portion in the plurality of portions of the source file from the portion in the plurality of portions of the target file.

In some implementations, the current subject matter can include one or more of the following optional features. The hashing can include hashing each non-overlapping portion in the plurality of portions of the source data file using the hashing function.

In some implementations, the hashing function can include at least one of the following: a djb2 hashing function and a CRC32 hashing function.

In some implementations, the generation of the source data file hashing table can include applying a first hashing mask to the hashed portion of the source data file, and mapping, based on the applied first hashing mask, the hashed portion of the source data file to the corresponding source file offset location in the source data file hashing table. The corresponding source file offset location can be determined based on a predetermined identifier (e.g., a "block number" as discussed in connection with FIGS. 4a-c above) corresponding to the portion in the plurality of portions. The predetermined identifier can be stored in the source data file hashing table. The hashing of the portion in the plurality of portions of the target data file can include applying a second hashing mask to the hashed portion of the target data file, and mapping, based on the applied second hashing mask, the hashed portion of the target data file to the corresponding target file offset location in the source data file hashing table.

In some implementations, a size of the source data file hashing table can be determined based on a size of the source data file. The portion in the plurality of portions of the source file can be 16 bytes.

The systems and methods disclosed herein can be embodied in various forms including, for example, a data processor, such as a computer that also includes a database, digital electronic circuitry, firmware, software, or in combinations of them. Moreover, the above-noted features and other aspects and principles of the present disclosed implementations can be implemented in various environments. Such environments and related applications can be specially constructed for performing the various processes and operations according to the disclosed implementations or they can include a general-purpose computer or computing platform selectively activated or reconfigured by code to provide the necessary functionality. The processes disclosed herein are not inherently related to any particular computer, network, architecture, environment, or other apparatus, and can be implemented by a suitable combination of hardware, software, and/or firmware. For example, various general-purpose machines can be used with programs written in accordance with teachings of the disclosed implementations, or it can be more convenient to construct a specialized apparatus or system to perform the required methods and techniques.

The systems and methods disclosed herein can be implemented as a computer program product, i.e., a computer program tangibly embodied in an information carrier, e.g., in a machine readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

As used herein, the term "user" can refer to any entity including a person or a computer.

Although ordinal numbers such as first, second, and the like can, in some situations, relate to an order; as used in this document ordinal numbers do not necessarily imply an order. For example, ordinal numbers can be merely used to distinguish one item from another. For example, to distinguish a first event from a second event, but need not imply any chronological ordering or a fixed reference system (such that a first event in one paragraph of the description can be different from a first event in another paragraph of the description).

The foregoing description is intended to illustrate but not to limit the scope of the invention, which is defined by the scope of the appended claims. Other implementations are within the scope of the following claims.

These computer programs, which can also be referred to programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, the subject matter described herein can be implemented on a computer having a display device, such as for example a cathode ray tube (CRT) or a liquid crystal display (LCD) monitor for displaying information to the user and a keyboard and a pointing device, such as for example a mouse or a trackball, by which the user can provide input to the computer. Other kinds of devices can be used to provide for interaction with a user as well. For example, feedback provided to the user can be any form of sensory feedback, such as for example visual feedback, auditory feedback, or tactile feedback; and input from the user can be received in any form, including, but not limited to, acoustic, speech, or tactile input.

The subject matter described herein can be implemented in a computing system that includes a back-end component, such as for example one or more data servers, or that includes a middleware component, such as for example one or more application servers, or that includes a front-end component, such as for example one or more client computers having a graphical user interface or a Web browser through which a user can interact with an implementation of the subject matter described herein, or any combination of such back-end, middleware, or front-end components. The components of the system can be interconnected by any form or medium of digital data communication, such as for example a communication network. Examples of communication networks include, but are not limited to, a local area network ("LAN"), a wide area network ("WAN"), and the Internet.

The computing system can include clients and servers. A client and server are generally, but not exclusively, remote from each other and typically interact through a communication network. The relationship of client and server arises by virtue of computer programs running on the respective computers and having a client-server relationship to each other.

The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations can be within the scope of the following claims.

What is claimed:

1. A computer implemented method for accelerating delta-compressing data, wherein a target data file is being delta-compressed against a source data file and having at least one common sequence of characters with the source file, the method comprising:

selecting, for a computing system, a hashing function for executing the accelerating of delta-compressing of data by the computing system;

hashing a plurality of non-overlapping portions of the source data file using the selected hashing function to generate a plurality of corresponding hash values;

encoding the source data file by generating a source data file hashing table having a plurality of entries, each entry in the plurality of entries including a first part storing an encoded hash value and a second part storing encoded source file offset location corresponding to the hash value, the source data file hashing table being stored in a storage location, wherein a size of the source data file hashing table is determined based on a size of the source data file, the encoded source file offset location being encoded using a corresponding hash value and a hash mask, the encoded hash value being encoded using a portion of bits of the hash value;

comparing, upon determining a match between one or more encoded source file offset locations and one or more target file offset locations, an encoded hash value at the matching encoded source file offset location to a hash value of a portion of the target file at the matching target file offset location, the target file having a plurality of portions;

determining, based on the comparing, at least one longest common sequence of characters in the one or more portions of the source file and the one or more portions of the target file being present at the matching encoded source file offset location and the matching target file offset location;

generating, based on the determining, a patch file having at least one of the following: at least one insert instruction and at least copy instruction; and delta-compressing the target file by replacing the target file with the generated patch file and writing the patch file into the storage location, the generated patch file having a smaller size than the target data file, wherein the one or more portions of the target file are generated by combining the one or more portions of the source file and the generated patch file.

2. The method according to claim 1, wherein the generating the source data file hashing table further comprises applying the hash mask to each hashed portion in the plurality of non-overlapping portions of the source data file; and mapping, based on the applied hash mask, each hashed portion in the plurality of non-overlapping portions of the source data file to the corresponding source file offset location in the source data file hashing table.

3. The method according to claim 2, wherein the corresponding source file offset location is determined based on a predetermined identifier corresponding to each portion in the plurality of portions, the predetermined identifier being stored in the source data file hashing table.

4. The method according to claim 3, further comprising applying the hash mask to each hash portion of the target data file; and comparing one or more masked hash values of the target data file to one or more masked values in the source data file hashing table.

5. The method according to claim 1, wherein each portion in the plurality of portions of the source file is 16 bytes.

6. The method according to claim 1, wherein the encoding further comprises initializing each entry in the source data file hashing table to a predetermined value.

7. The method according to claim 1, wherein the plurality of portions of the target file include at least one of the following: overlapping portions, non-overlapping portions, and any combination thereof.

8. The method according to claim 1, wherein a predetermined number of bits is allocated to a combined size of the first and second parts, the first part having a size of a first number of bits and the second part having a size of a second number of bits;

the second number of bits is determined based on the size of the source file and is allocated from the predetermined number of bits; and the first number of bits is determined based on bits remaining in the predetermined number of bits after the second number of bits are allocated.

9. The method according to claim 8, wherein the hash mask is determined based on the second number of bits.

10. A system for accelerating delta-compressing data, wherein a target data file is being delta-compressed against a source data file and having at least one common sequence of characters with the source file, the system comprising:

at least one programmable processor; and a non-transitory machine-readable medium storing instructions that, when executed by the at least one programmable processor, cause the at least one programmable processor to perform operations comprising:

selecting, for a computing system, a hashing function for executing the accelerating of delta-compressing of data by the computing system;

hashing a plurality of non-overlapping portions of the source data file using the selected hashing function to generate a plurality of corresponding hash values;

encoding the source data file by generating a source data file hashing table having a plurality of entries, each entry in the plurality of entries including a first part storing an encoded hash value and a second part storing encoded source file offset location corresponding to the hash value, the source data file hashing table being stored in a storage location, wherein a size of the source data file hashing table is determined based on a size of the source data file, the encoded source file offset location being encoded using a corresponding hash value and a hash mask, the encoded hash value being encoded using a portion of bits of the hash value;

comparing, upon determining a match between one or more encoded source file offset locations and one or more target file offset locations, an encoded hash value at the matching encoded source file offset location to a hash value of a portion of the target file at the matching target file offset location, the target file having a plurality of portions;

determining, based on the comparing, at least one longest common sequence of characters in the one or more portions of the source file and the one or more portions of the target file being present at the matching encoded source file offset location and the matching target file offset location;

generating, based on the determining, a patch file having at least one of the following: at least one insert instruction and at least copy instruction; and delta-compressing the target file by replacing the target file with the generated patch file and writing the patch file into the storage location, the generated patch file having a smaller size than the target data file, wherein the one or more portions of the target file are generated by combining the one or more portions of the source file and the generated patch file.

11. The system according to claim 10, wherein the generating the source data file hashing table further comprises applying the hash mask to each hashed portion in the plurality of non-overlapping portions of the source data file; and mapping, based on the applied hash mask, each hashed portion in the plurality of non-overlapping portions of the source data file to the corresponding source file offset location in the source data file hashing table.

12. The system according to claim 11, wherein the corresponding source file offset location is determined based on a predetermined identifier corresponding to each portion in the plurality of portions, the predetermined identifier being stored in the source data file hashing table.

13. The system according to claim 12, wherein the operations further comprise applying the hash mask to each hash portion of the target data file; and comparing one or more masked hash values of the target data file to one or more masked values in the source data file hashing table.

14. The system according to claim 10, wherein each portion in the plurality of portions of the source file is 16 bytes.

15. The system according to claim 10, wherein the encoding further comprises initializing each entry in the source data file hashing table to a predetermined value.

16. The system according to claim 10, wherein the plurality of portions of the target file include at least one of the following: overlapping portions, non-overlapping portions, and any combination thereof.

17. The system according to claim 10, wherein a predetermined number of bits is allocated to a combined size of the first and second parts, the first part having a size of a first number of bits and the second part having a size of a second number of bits;

the second number of bits is determined based on the size of the source file and is allocated from the predetermined number of bits; and the first number of bits is determined based on bits remaining in the predetermined number of bits after the second number of bits are allocated.

18. The system according to claim 17, wherein the hash mask is determined based on the second number of bits.

19. A computer program product for accelerating delta-compressing data, wherein a target data file is being delta-compressed against a source data file and having at least one common sequence of characters with the source file, the computer program product comprising a non-transitory machine-readable medium storing instructions that, when executed by at least one programmable processor, cause the at least one programmable processor to perform operations comprising:

selecting, for a computing system, a hashing function for executing the accelerating of delta-compressing of data by the computing system;

hashing a plurality of non-overlapping portions of the source data file using the selected hashing function to generate a plurality of corresponding hash values;

encoding the source data file by generating a source data file hashing table having a plurality of entries, each entry in the plurality of entries including a first part storing an encoded hash value and a second part storing encoded source file offset location corresponding to the hash value, the source data file hashing table being stored in a storage location, wherein a size of the source data file hashing table is determined based on a size of the source data file, the encoded source file offset location being encoded using a corresponding hash value and a hash mask, the encoded hash value being encoded using a portion of bits of the hash value;

comparing, upon determining a match between one or more encoded source file offset locations and one or more target file offset locations, an encoded hash value at the matching encoded source file offset location to a hash value of a portion of the target file at the matching target file offset location, the target file having a plurality of portions;

determining, based on the comparing, at least one longest common sequence of characters in the one or more portions of the source file and the one or more portions of the target file being present at the matching encoded source file offset location and the matching target file offset location;

generating, based on the determining, a patch file having at least one of the following: at least one insert instruction and at least copy instruction; and delta-compressing the target file by replacing the target file with the generated patch file and writing the patch file into the storage location, the generated patch file having a smaller size than the target data file, wherein the one or more portions of the target file are generated by combining the one or more portions of the source file and the generated patch file.

20. The computer program product according to claim 19, wherein the generating the source data file hashing table further comprises applying the hash mask to each hashed portion in the plurality of non-overlapping portions of the source data file; and mapping, based on the applied hash mask, each hashed portion in the plurality of non-overlapping portions of the source data file to the corresponding source file offset location in the source data file hashing table.

21. The computer program product according to claim 20, wherein the corresponding source file offset location is determined based on a predetermined identifier corresponding to each portion in the plurality of portions, the predetermined identifier being stored in the source data file hashing table.

22. The computer program product according to claim 21, wherein the operations further comprise applying the hash mask to each hash portion of the target data file; and comparing one or more masked hash values of the target data file to one or more masked values in the source data file hashing table.

23. The computer program product according to claim 19, wherein each portion in the plurality of portions of the source file is 16 bytes.

24. The computer program product according to claim 19, wherein the encoding further comprises
   initializing each entry in the source data file hashing table to a predetermined value.

25. The computer program product according to claim 19, wherein the plurality of portions of the target file include at least one of the following: overlapping portions, non-overlapping portions, and any combination thereof.

26. The computer program product according to claim 19, wherein
   a predetermined number of bits is allocated to a combined size of the first and second parts, the first part having a size of a first number of bits and the second part having a size of a second number of bits;
   the second number of bits is determined based on the size of the source file and is allocated from the predetermined number of bits; and
   the first number of bits is determined based on bits remaining in the predetermined number of bits after the second number of bits are allocated.

27. The computer program product according to claim 26, wherein the hash mask is determined based on the second number of bits.

* * * * *